US008598651B2

(12) United States Patent
Oga et al.

(10) Patent No.: US 8,598,651 B2
(45) Date of Patent: Dec. 3, 2013

(54) SEMICONDUCTOR DEVICE WITH TRANSISTOR HAVING GATE INSULATING FILM WITH VARIOUS THICKNESSES AND MANUFACTURING METHOD THEREOF

(75) Inventors: Atsushi Oga, Kanagawa (JP); Hiroshi Kawaguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 179 days.

(21) Appl. No.: 13/113,801

(22) Filed: May 23, 2011

(65) Prior Publication Data

US 2011/0284952 A1 Nov. 24, 2011

(30) Foreign Application Priority Data

May 24, 2010 (JP) .................... 2010-118658

(51) Int. Cl.
*H01L 29/792* (2006.01)
(52) U.S. Cl.
USPC .............. 257/330; 257/E29.262; 438/270
(58) Field of Classification Search
CPC .............. H01L 21/76232; H01L 21/76229
USPC .............. 257/300, E29.262; 438/270
See application file for complete search history.

(56) References Cited

U.S. PATENT DOCUMENTS

| 6,452,231 B1 | 9/2002 | Nakagawa et al. |
| 2004/0089892 A1* | 5/2004 | Suzuki ............... 257/302 |
| 2006/0097314 A1* | 5/2006 | Uchiyama ............. 257/330 |
| 2007/0052013 A1* | 3/2007 | Kim et al. ............ 257/330 |
| 2009/0001458 A1* | 1/2009 | Chung et al. ......... 257/330 |
| 2009/0321802 A1* | 12/2009 | Choi ................. 257/296 |
| 2010/0059816 A1 | 3/2010 | Shimada et al. |
| 2010/0109055 A1 | 5/2010 | Kim |

FOREIGN PATENT DOCUMENTS

| JP | 51-147269 A | 12/1976 |
| JP | 10-032331 A | 2/1998 |
| JP | 11-103058 A | 4/1999 |
| JP | 2007-081396 A | 3/2007 |
| JP | 2009-088188 A | 4/2009 |

* cited by examiner

*Primary Examiner* — Fernando L Toledo
*Assistant Examiner* — Peter Bradford
(74) *Attorney, Agent, or Firm* — Sughrue Mion, PLLC

(57) ABSTRACT

A semiconductor device includes a transistor having multiple trenches with the thickness thereof being intermittently changed in the lateral direction of a gate, a gate insulating film formed on the side walls and at the bottom of each of the trenches, a gate electrode formed over the gate insulating film, a source region formed in the surface of the substrate on one side in the longitudinal direction of the gate, and a drain region formed in the surface of the substrate on the other side in the longitudinal direction of the gate. The thickness of the gate insulating film in the lower portion of the side wall of the trench from an intermediate position directing from the surface of the substrate to the bottom of the trench to the bottom thereof is larger than the thickness of the gate insulating film in the upper portion on the side wall of the trench from the intermediate position directing from the surface of the substrate to the bottom of the trench and equal with or larger than the thickness of the gate insulating film at the bottom of the trench.

4 Claims, 19 Drawing Sheets

SEMICONDUCTOR DEVICE WITH TRANSISTOR HAVING GATE INSULATING FILM WITH VARIOUS THICKNESSES AND MANUFACTURING METHOD THEREOF

CROSS-REFERENCE TO RELATED APPLICATION

The disclosure of Japanese Patent Application No. 2010-118658 filed on May 24, 2010 including the specification, drawings and abstract is incorporated herein by reference in its entirety.

BACKGROUND

The present invention relates to a semiconductor device and a manufacturing method thereof.

For extending a substantial channel width of a transistor without increasing the size, a technique of forming unevenness such as trenches to a substrate in a channel region has been known.

For example, Japanese Unexamined Patent Publication No. Hei11(1999)-103058 (JP-A-1999-103058) and Japanese Unexamined Patent Publication No. Sho51 (1976)-147269 (JP-A-1976-147269) describe semiconductor devices including transistors of a trench gate structure in which a trench is formed to the surface of a substrate.

Vertical MOS transistors in which a current path is in a longitudinal direction have also been known, which are different from the lateral transistors described in JP-A-1999-103058 and JP-A-1976-147269. Japanese Unexamined Patent Publication No. Hei10 (1998)-32331 (JP-A-1998-32331) describes the configuration of a vertical type MOS transistor. The vertical type MOS transistor involves a problem that a parasitic capacitance defined with an n⁻ electric field relaxation region and a gate electrode by way of a gate oxide film is larger in view of a chip area ratio and a feedback capacitance increases to increase a switching loss compared with that of the lateral MOS transistor. Then, JP-A-1998-32331 describes a configuration of increasing the thickness of the gate insulating film only at the bottom of the trench, which can decrease the parasitic capacitance defined with the n⁻ electric field relaxation region and the gate electrode while keeping a threshold value of the vertical type MOS transistor lower thereby decreasing the switching loss.

Further, Japanese Unexamined Patent Publication No. 2009-88188 (JP-A-2009-77188) also describes a configuration of a vertical MOS transistor. JP-A-2009-77188 describes a configuration of forming a uniformly thick silicon oxide film rounded at the corner at the bottom and the vicinity thereof in a trench formed to an N-type semiconductor layer. On the other hand, a silicon oxide film with a thickness smaller than that of the silicon oxide film at the bottom and the vicinity thereof and rounded at the corner is formed above the side wall of the trench. It is described that the thick silicon oxide film decreases the gate capacitance, the thin silicon oxide film thereabove can ensure the excellent transistor characteristic, and the roundness at the corner can suppress the generation of crystal defects and disperse the gate electric field to improve the gate voltage withstanding.

Further, Japanese Unexamined Patent Publication No. 2007-81396 (JP-A-2007-81396) describes an MOS transistor having a semiconductor substrate having a main surface of a (100) plane, and describes that a source region and a drain region are arranged on a linear line parallel with the <100> direction.

SUMMARY

However, the lateral transistors shown in JP-A-1999-103058 and JP-A-1976-147269 involve a drawback that an electric field to be applied uniformly from a gate electrode increases at the lower end of the channel in the lower portion of the trench and the transistor starts operation at a threshold voltage lower than the designed voltage.

According to an aspect of the invention, a semiconductor device includes a substrate containing a device forming region partitioned by a device isolation insulating film, and a transistor formed in the device forming region of the substrate and having multiple trenches the depth thereof being intermittently changed in the lateral direction of the gate, a gate insulating film formed on the side walls and at the bottom of each of the trenches, a gate electrode formed over the gate insulating film so as to fill the trenches, a source region formed on one side of the gate electrode in the longitudinal direction of the gate at the surface of the substrate, and a drain region formed on the other side of the gate electrode in the longitudinal direction at the surface of the substrate, and the thickness of the gate insulating film in the lower portion of the side wall of the trench from an intermediate position directing from the surface of the substrate to the bottom of the trench to the bottom thereof is larger than the thickness of the gate insulating film in the upper portion on the side wall of the trench from the intermediate position directing from the surface of the substrate to the bottom of the trench and equal with or larger than the thickness of the gate insulating film at the bottom.

According to another aspect of the present invention, a method of manufacturing a semiconductor device having a transistor, includes the steps of:

implanting ions of second conduction type impurities into a device forming region formed on one surface of a substrate and partitioned with a device isolation insulating film thereby forming a channel region, forming multiple trenches in the channel region in the one surface of the substrate such that the depth thereof changes intermittently in the lateral direction of the gate, forming a gate insulating film to the one surface of the substrate and covering the side wall and at the bottom of the trenches with the gate insulating film, forming a gate electrode so as to fill the inside of the trenches, patterning the gate insulating film and the gate electrode into a predetermined shape, implanting ions of first conduction type impurities to both lateral sides of the channel region in the one surface of the substrate in the longitudinal direction of the gate thereby forming a source region and a drain region, and in the step of covering the side walls and the bottom of the trenches with the gate insulating film, the thickness of the gate insulating film in the lower portion of the side wall of the trench from an intermediate position directing from the surface of the substrate to the bottom of the trench to the bottom thereof is larger than the thickness of the gate insulating film in the upper portion on the side wall of the trench from the intermediate position directing from the surface of the substrate to the bottom of the trench and equal with or larger than the thickness of the gate insulating film at the bottom.

According to the configuration described above, the electric field exerting on the lower end of the channel in the lower portion of the trench can be moderate by making the thickness of the gate insulating film in the lower portion of the trench side wall larger than the thickness of the gate insulating film in the upper portion of the side wall, thereby capable of suppressing the parasitic transistor operation in which the transistor starts operation at a threshold voltage lower than a designed voltage. As described above, undesired effect of the parasitic transistor operation can be decreased by partially increasing the thickness of the gate insulating film.

An optional combination of the constituent elements described above, and embodiments expressing the invention as methods, apparatus, etc. are also effective.

According to the invention, it is possible to suppress the parasitic transistor operation that the transistor starts operation at a threshold voltage lower than the designed voltage.

BRIEF DESCRIPTION OF THE DRAWINGS

FIGS. 4A and 4B are cross sectional step views showing an example of a manufacturing procedure of a semiconductor device in the first embodiment of the invention in which FIG. 4A is a first step of the manufacturing procedure and
FIG. 4B is a step succeeding to the step in FIG. 4A;

FIGS. 5A and 5B are cross sectional step views showing the example of the manufacturing procedure of the semiconductor device in an embodiment of the invention in which FIG. 5A is a step succeeding to the step in FIG. 4B and
FIG. 5B is a step succeeding to the step in FIG. 5A;

FIGS. 6A and 6B are cross sectional step views showing the example of the manufacturing procedure of the semiconductor device in the embodiment of the invention in which FIG. 6A is a step succeeding to the step in FIG. 5B and
FIG. 6B is a step succeeding to the step in FIG. 6A;

FIGS. 7A and 7B are cross sectional step views showing an example of the manufacturing procedure of the semiconductor device in the embodiment of the invention in which FIG. 7A is a step succeeding to the step in FIG. 6B and
FIG. 7B is a step succeeding to the step in FIG. 7A;

FIGS. 8A and 8B are cross sectional step views showing an example of the manufacturing procedure of the semiconductor device in the embodiment of the invention in which FIG. 8A is a step succeeding to the step in FIG. 7b) and
FIG. 8B is a step succeeding to the step in FIG. 8a);

FIGS. 12A and 12B are cross sectional step views showing an example of a manufacturing procedure of a semiconductor device in a second embodiment of the invention in which FIG. 12A is a first step of the manufacturing procedure and
FIG. 12B is a step succeeding to the step in FIG. 12A;

FIGS. 13A and 13B are cross sectional step views showing the example of the manufacturing procedure of the semiconductor device in the embodiment of the invention in which FIG. 13A is a step succeeding to the step in FIG. 12B and
FIG. 13B is a step succeeding to the step in FIG. 13A;

FIGS. 14A and 14B are cross sectional step views showing an example of the manufacturing procedure of the semiconductor device in the embodiment of the invention in which FIG. 14A is a step succeeding to the step in FIG. 13B and
FIG. 14B is a step succeeding to the step in FIG. 14A;

FIGS. 15A and 15B are cross sectional step views showing an example of the manufacturing procedure of the semiconductor device in the embodiment of the invention in which FIG. 15A is a step succeeding to the step in FIG. 14B and
FIG. 15B is a step succeeding to the step in FIG. 15A;

FIG. 16 is cross sectional step views showing an example of the manufacturing procedure of the semiconductor device in the embodiment of the invention in which FIG. 17 is cross sectional step views showing an example of the manufacturing procedure of the semiconductor device in the embodiment of the invention in which FIGS. 18A and 18B are cross sectional step views showing another example of the manufacturing procedure of the semiconductor device in the embodiment of the invention in which FIG. 18A is a step succeeding to the step in FIG. 17B and
FIG. 18B is a step succeeding to the step in FIG. 18A;

FIGS. 19A and 19B are cross sectional step views showing the another example of the manufacturing procedure of the semiconductor device in the embodiment of the invention in which FIG. 19A is a step succeeding to the step in FIG. 18B and
FIG. 19B is a step succeeding to the step in FIG. 19A;

FIG. 20 is cross sectional step views showing other example of the manufacturing procedure of the semiconductor device in the embodiment of the invention in which
FIGS. 21A and 21B are cross sectional step views showing a further other example of the manufacturing procedure of the semiconductor device in the embodiment of the invention in which
FIG. 21A is a step succeeding to the step in FIG. 20B
and
FIG. 21B is a step succeeding to the step in FIG. 21A.

DETAILED DESCRIPTION

Preferred embodiments of the invention are to be described below with reference to the drawings. Throughout the drawings, identical constituent elements carry the same numerals for which descriptions are omitted optionally.

First Embodiment

Figure 1:
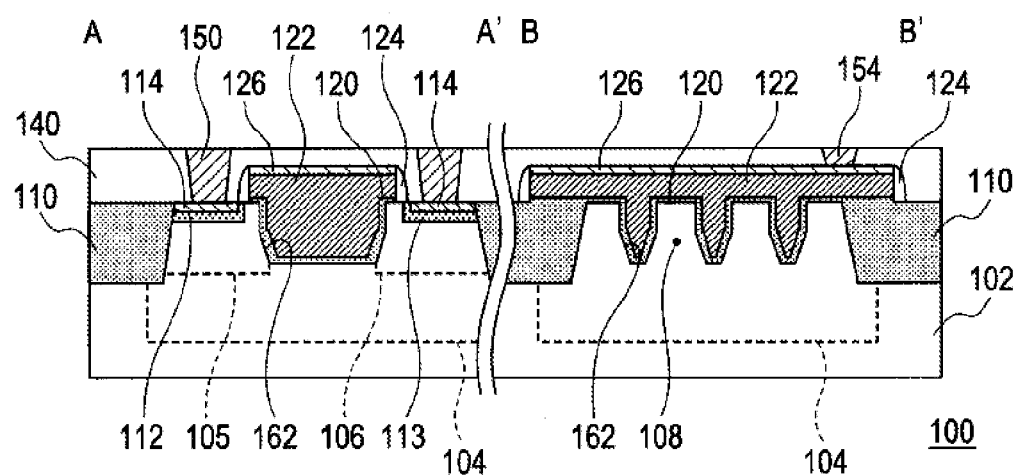
FIG. 1 is a cross sectional view showing an example of a configuration of a semiconductor device of a first embodiment of the invention.
Figure 2:
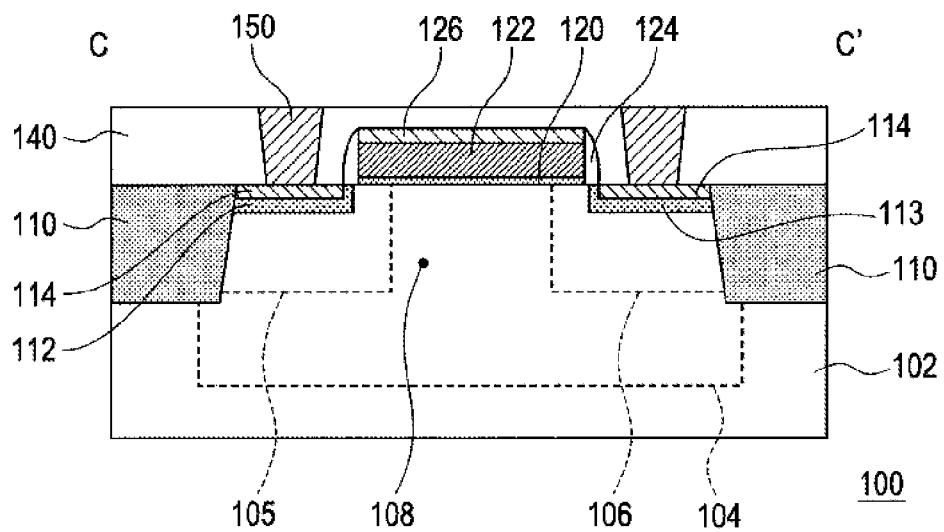
FIG. 2 is a cross sectional view showing an example of a configuration of the semiconductor device in the embodiment of the invention.
Figure 3:
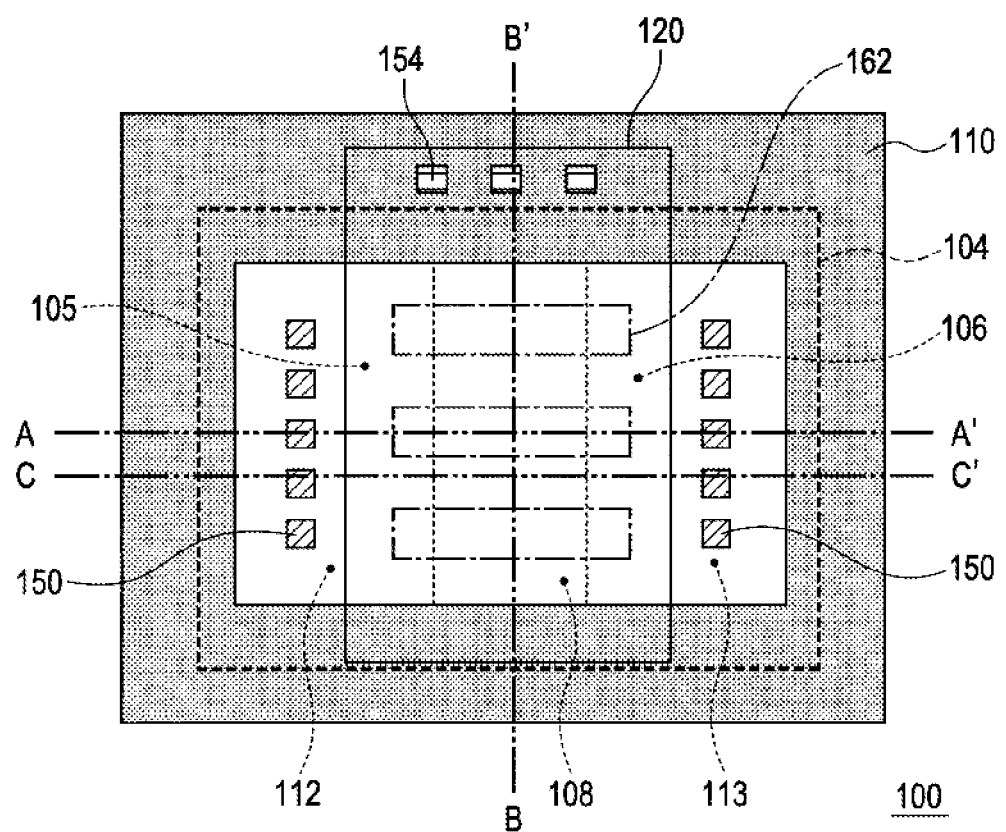
FIG. 3 is a plan view showing an example of a configuration of the semiconductor device of the embodiment of the invention.

FIG. 1 and FIG. 2 are cross sectional views showing an example for the configuration of a semiconductor device in this embodiment. FIG. 3 is a plan view showing the example for the configuration of the semiconductor device in this embodiment. FIG. 1 is a view showing a cross section along A-A' in FIG. 3 and a cross section along B-B' in FIG. 3, respectively. FIG. 2 is a cross sectional view along C-C' in FIG. 3. For the sake of easy understanding of the configuration, each of the regions is shown only by means of lines in FIG. 3. Further, while FIG. 3 shows a configuration in which a first conduction type is an n-type and a second conduction type is a p-type as an example, the conduction type can be replaced with each other in other examples.

A semiconductor device 100 includes a substrate 102 and a transistor formed on one surface of the substrate 102. The substrate 102 may be a semiconductor substrate such as a silicon substrate. The semiconductor device 100 includes a device isolation insulating film 110 formed in the substrate 102, a device forming region partitioned by the device isolation insulating film 110, and a transistor formed in the device forming region.

A well 104 which is a p-type (second conduction type) impurity diffusion layer, a source region 112 and a drain region 113 which are n-type (first conduction type) impurity diffusion regions, and an offset region 105 and an offset region 106 which are n-type (first conduction type) impurity diffusion regions disposed respectively to the outer periphery of the source region 112, and the drain region 113 are formed in the device forming region on one surface of the substrate 102.

The offset region 105 and the offset region 106, and the source region 112 and the drain region 113 are formed in the well 104. In the well 104, a region disposed between the source region 112 and the drain region 113 in the longitudinal direction of the gate and defined by the offset region 105 and the offset region 106 is a p-type (second conduction type) channel region 108. Also in FIG. 1 and FIG. 2, the well region 104, the offset region 105, and the offset region 106 are shown only by means of lines (broken lines) for making the configuration easy to see.

The semiconductor device 100 includes, in the channel region 108 in one surface of the substrate 102, multiple trenches 162 which change in depth intermittently in the lateral direction of the gate, a gate insulating film 120 formed on the side walls and at the bottom of each of the trenches 162, a gate electrode 122 formed over the gate insulating film 120 so as to fill the trenches 162, and a side wall 124 formed on the side wall of the gate electrode 122. The gate insulating film 120 is disposed also between the substrate 102 on the surface of the substrate 102 and the gate electrode 122 outside the trench 162.

In this embodiment, a silicide layer 114 is formed on the surface of the source region 112 and the drain region 113, and a silicide layer 126 is formed on the surface of the gate electrode 122 respectively. An interlayer insulating film 140 is formed over the substrate 102. The interlayer insulating film 104 is formed with a contact 150 coupled to the source region 112 and the silicide layer 114 over the drain region 113 respectively, and a contact 154 coupled to the silicide layer 126 over the gate electrode 122.

The device isolation insulating film 110 is disposed in the longitudinal direction of the gate on the side of the source region 112 and the drain region 113, and formed in the lateral direction of the gate on both sides of the trench 162, and formed at the periphery of the region where the transistor is formed thereby partitioning and isolating the transistor forming region from other regions.

The transistor includes mainly the source region 112, the drain region 113, the offset region 105, the offset region 106, the gate insulating film 120, the gate electrode 122, the channel region 108, and the trenches 162.

Figure 10:
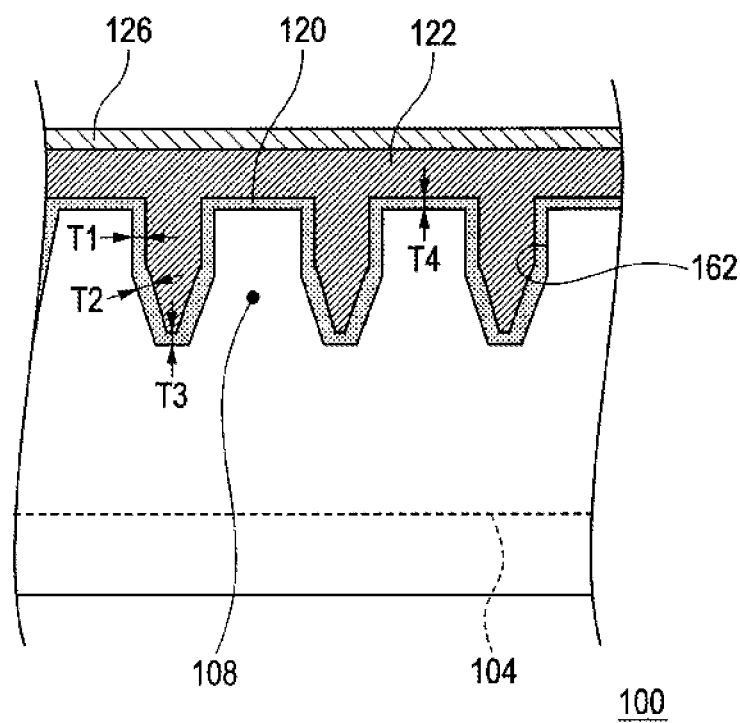
FIG. 10 is an enlarged cross sectional view showing a configuration of a trench portion in the embodiment of the invention.

FIG. 10 is an enlarged cross sectional view showing the configuration for the portion of the trenches 162 in this embodiment.

In this embodiment, the thickness T2 of the gate insulating film in the lower portion of the side wall of the trench 162 from an intermediate position directing from the surface of the substrate 102 to the bottom of the trench 162 to the bottom thereof is made larger than the thickness T1 of the gate insulating film 120 in the upper portion on the side wall of the trench 162 from the intermediate position to the surface of the substrate 102. Further, the thickness T2 of the gate insulating film 120 in the lower portion of the side wall of the trench 162 can be made equal with or larger than the thickness T3 of the gate insulating film 120 at the bottom of the trench 162.

Further, in this embodiment, the thickness T2 of the gate insulating film 120 in the lower portion of the side wall of the trench 162 is made equal with or larger than the thickness T4 of the gate insulating film at the surface of the substrate 102, with no particular restriction. Further, the thickness T3 of the gate insulating film 120 at the bottom of the trench 162 can be decreased to about the thickness T1 of the gate insulating film 120 in the upper portion of the side wall of the trench 162 having no effect, for example, on the transistor withstanding voltage. For example, the thickness T3 of the gate insulating film 120 at the bottom of the trench 162 can be made about equal with the thickness T1 of the gate insulating film 120 in the upper portion of the side wall of the trench 162.

In the example shown in FIG. 10, the thickness T2 of the gate insulating film 120 in the lower portion of the side wall of the trench 162 is made larger than the thickness T3 of the gate insulating film 120 at the bottom of the trench 162. Further, in this example, the thickness T2 of the gate insulating film 120 in the lower portion of the side wall of the trench 162 is made larger than the thickness T4 of the gate insulating film 120 at the surface of the substrate 102.

Then, a procedure for manufacturing a semiconductor device 100 in this embodiment is to be described.

FIGS. 4 to 9 are cross sectional step views showing an example of a procedure for manufacturing the semiconductor device 100 in this embodiment. Views corresponding to the cross section along A-A' and the cross section along B-B' in FIG. 3 are shown.

In the following description, only the processing for the n-type transistor-forming region is to be described.

Figure 4A:
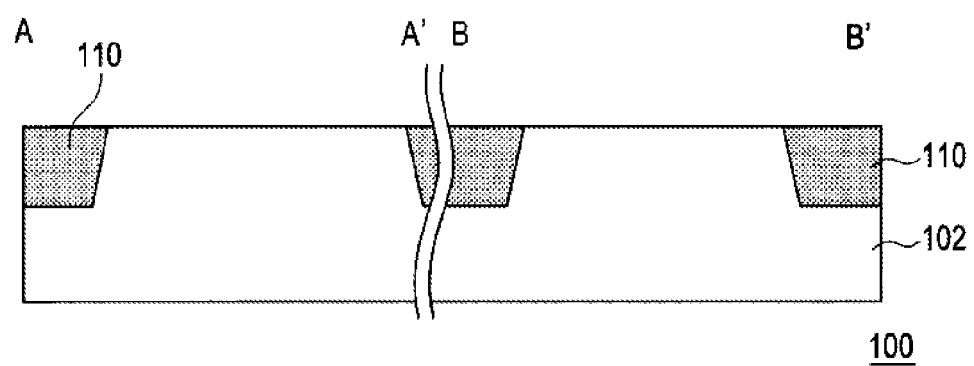

At first, a device isolation insulating film 110 is formed to one surface of a substrate 102 (FIG. 4A). The device isolation insulating film 110 can be formed, for example, as STI (shallow trench isolation). Although not particularly restricted, the thickness of the device isolation insulating film 110 can be, for example, about 300 nm to 1 µm. In this embodiment, it can be formed such that the plane direction at the surface of the substrate 102 and that at the plane perpendicular to the surface can be a (100) plane (refer to the Patent Document 5).

Figure 4B:
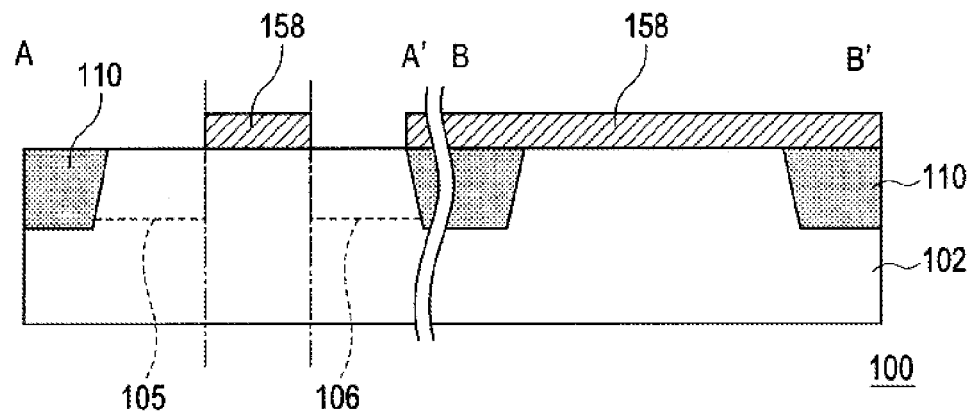

Successively, a resist film 158 having regions opened for forming an offset region 105 and an offset region 106 is formed on one surface of the substrate 102. Then, ions of n-type (first conduction type) impurities such as phosphorous are ion implanted over the entire surface of the substrate 102 to form an offset region 105 and the offset region 106 (FIG. 4B). In this case, the n-type impurity concentration in the offset region 105 and the offset region 106 can be set, for example, to about $1\times10^{16}$ atoms/cm$^3$ to $1\times10^{18}$ atoms/cm$^3$. Then, the resist film 158 is removed.

Successively, a not illustrated resist film having an opening for a region for forming the well 104 is formed over the substrate 102. Then, ions of p-type (second conduction type) impurities such as boron B are ion implanted over the entire surface of the substrate 102 by using the resist film as a mask to form a well 104. The concentration of the p-type impurities of the well 104 can be set, for example, to about 1E15 atoms/cm$^3$ to 1E17 atoms/cm$^3$. Subsequently, the resist film is removed.

Successively, a thermal oxide film 160 is formed on one surface of the substrate 102 and a resist film 170 having multiple openings 172 formed therein for forming the trenches are formed further thereover. Each of the openings 172 is formed such that the width is equal in the longitudinal direction of the gate. Further, the opening can be formed such that the gaps between adjacent openings 172 in the longitudinal direction of the gate can be equal with each other.

Figure 5A:
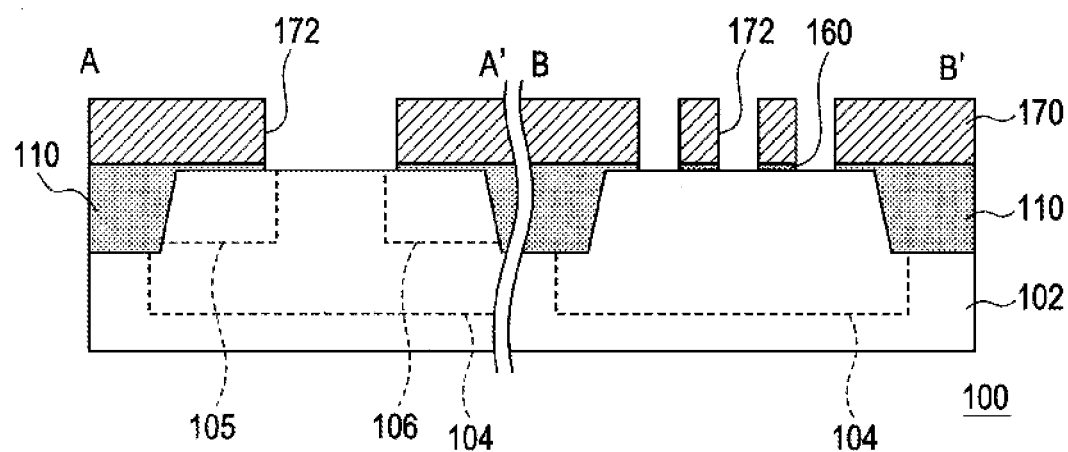

Then, the thermal oxide film 160 is removed by etching to expose the surface of the substrate 102 through the opening 172 by using the resist film 170 as a mask (FIG. 5A). Then, the resist film 170 is removed and the substrate 102 is plasma-etched through the opening by using the thermal oxide film 160 as a mask to form multiple trenches 162.

In this embodiment, the substrate 102 can be etched under the etching condition that the side wall of the trench 162 is substantially vertical to the in-plane direction of the substrate 102 in the upper portion of the side wall from the surface of the substrate 102 to the intermediate position directing from the surface of the substrate 102 to the bottom of the trench and that the trench is tapered so that the diameter of the trench is gradually decreased from the intermediate position to the bottom of the substrate 102.

Figure 5B:
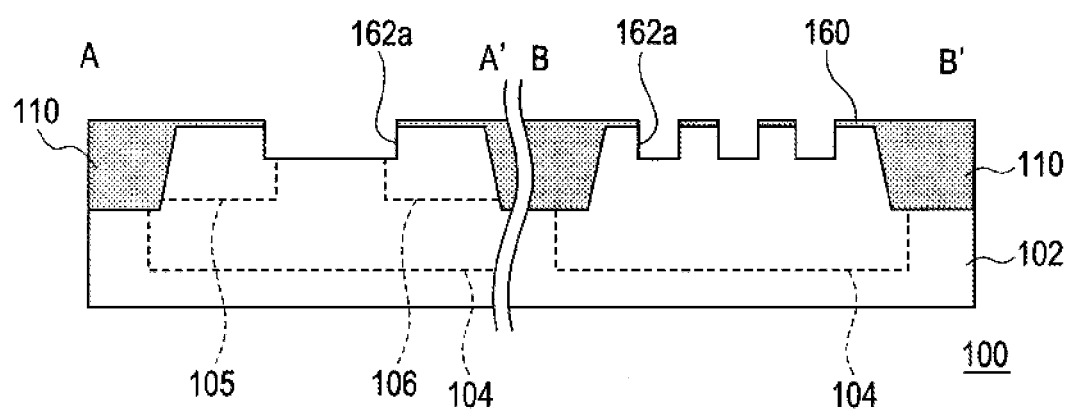
Figure 6A:
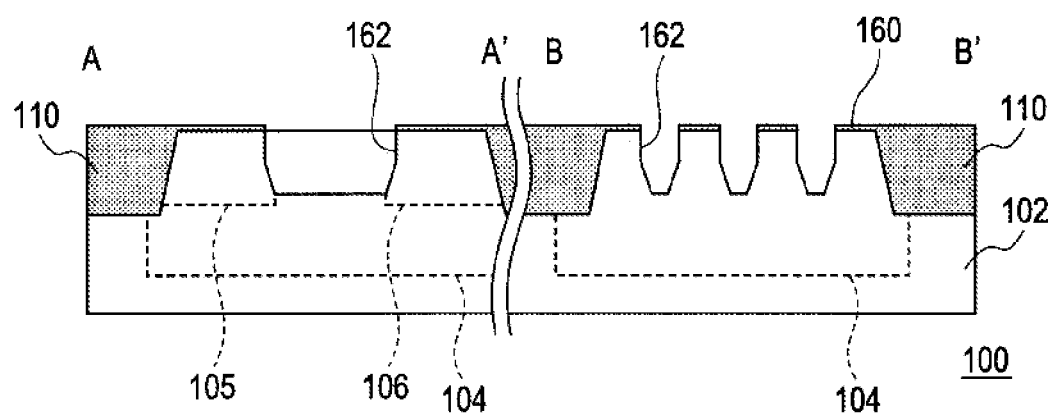
Figure 6B:
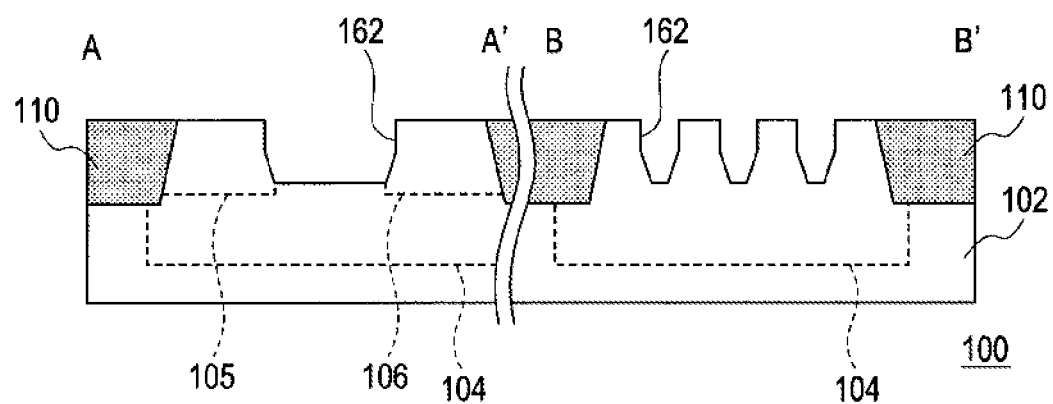

As an example, the substrate 102 can be etched such that it is at first etched to the intermediate position under the first etching condition and, subsequently, under the second etching condition of downwardly decreasing the diameter of the trench formed in the substrate 102. In this case, the substrate 102 is at first etched to the intermediate position under the first etching condition to form a trench 162a (FIG. 5B). Under the first etching condition, anisotropic etching is performed so that the trenches 162a keep the opening area for the opening in the thermal oxide film 160. That is, the first etching condition can be set to a condition of etching the substrate 102 such that the side walls of the trench 162a are substantially vertical to the in-plane direction of the substrate 102. Then, the substrate 102 is etched under the second etching condition to form a trench 162 having a depth larger than that of the trench 162a (FIG. 6A). Under the second etching condition, the substrate 102 is etched so as to have such a taper that the diameter of each trench 162 is gradually narrowed toward the bottom.

As another example, the substrate 102 can be etched also under the etching condition that the diameter of the trench 162 is gradually narrowed toward the bottom from a certain depth or more as the trench 162 becomes deeper.

In this embodiment, the depth of the trench 162 (depth from the surface of the substrate 102 to the bottom of the trench 162) can be, for example, about from 500 nm to 2 μm.

Thus, in the trench 162, a (100) plane is exposed in the upper portion of the side wall from the surface of the substrate 102 to the intermediate position. On the other hand, in the trench 162, a different displaced plane from the (100) plane is exposed in the lower portion of the side wall from the intermediate position directing from the surface of the substrate 102 to the bottom of the trench 162 is exposed. Further, the (100) plane is exposed also at the bottom of the trench 162.

Figure 7A:
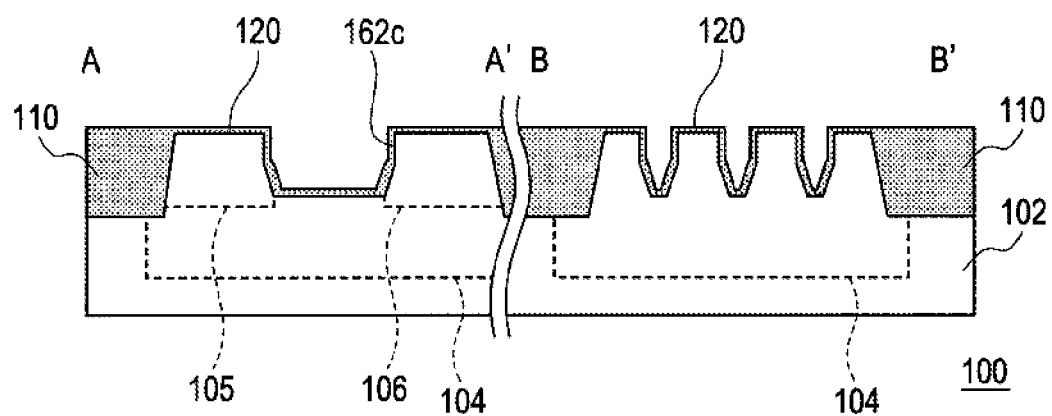

Then, after removing the thermal oxide film 160, for example, by a diluted hydrofluoric acid (FIG. 6B), the surface of the substrate 102 is thermally oxidized to form a gate insulating film 120 in the trench 162 and at the surface of the substrate 102 (FIG. 7A). In this embodiment, as described above, the plane direction at the surface of the substrate 102 and the surface vertical thereto are formed as the (100) plane (refer to JP-A-2007-81396). Upon formation of the thermal oxide film to the silicon substrate, the oxidizing rate is lowest at the (100) plane when heating is performed in a general mixed atmosphere of hydrogen and oxygen (for example, refer to Formation of an ultra-thin silicon oxide film and interface evaluation technique by Shigeru Nomura, Ei Fukuda, Realize Scientific Center, pages 28 to 29, Published Jan. 31, 1997). Accordingly, as has been described above with reference to FIG. 10, the thickness of the gate insulating film is thin at the surface of the substrate 102, at the bottom of the trench 162 and in the upper portion of the side walls of the trench 162, and the thickness is increased in the tapered portion in the lower portion of the side walls of the trench 162.

As another method of forming the trench 162, the trench 162 can be formed also by using the resist film 170 and the oxide film 160 as a mask while leaving the resist film 170 as it is. In this case, after forming the trench 162, the thermal oxide film 160 is removed after removing the resist film 170.

Figure 7B:
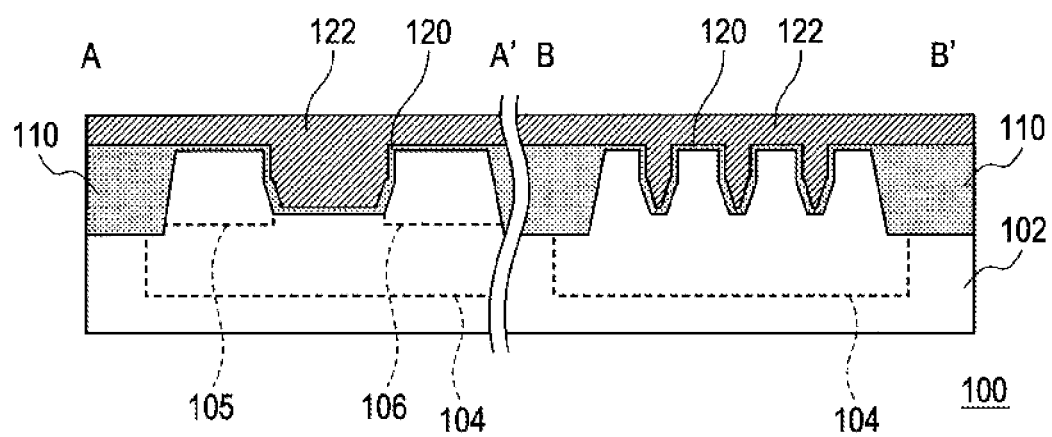
Figure 8A:
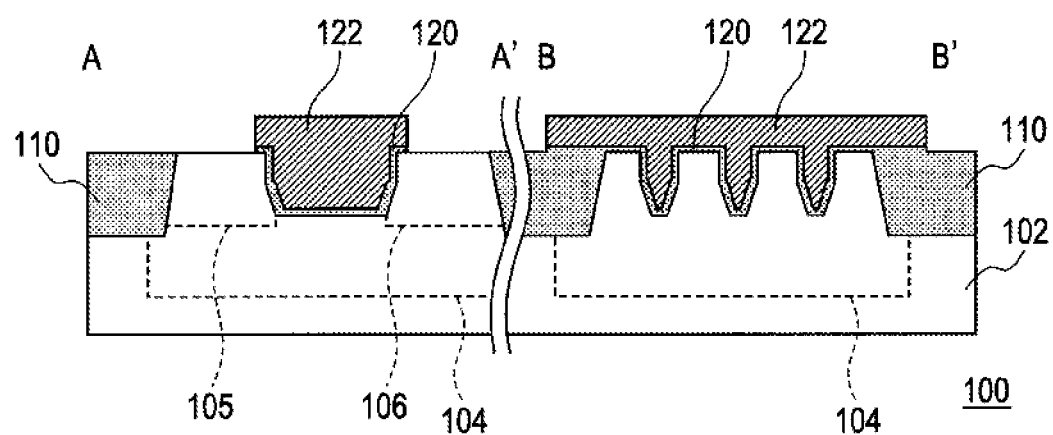

Then, a conductive film for forming a gate electrode 122 is formed over the entire surface of the substrate 102 (FIG. 7B). The conductive film as the gate electrode 122 can be formed, for example, of polysilicon. Successively, the gate electrode 122 and the gate insulating film 120 are patterned into a gate shape (FIG. 8A). While the gate insulating film 120 is patterned by using the gate electrode 122 as a mask in this example, patterning of the gate insulating film 120 may be omitted. Further, patterning for the gate insulating film 120 in this step may be omitted and the gate insulating film 120 may be patterned when the side wall 124 is formed. Further, after removing the resist film 123, a resist film (not illustrated) may be further formed optionally and the gate insulating film 120 over the diffusion layer may be patterned and removed by using the resist film while changing the etching condition.

Figure 8B:
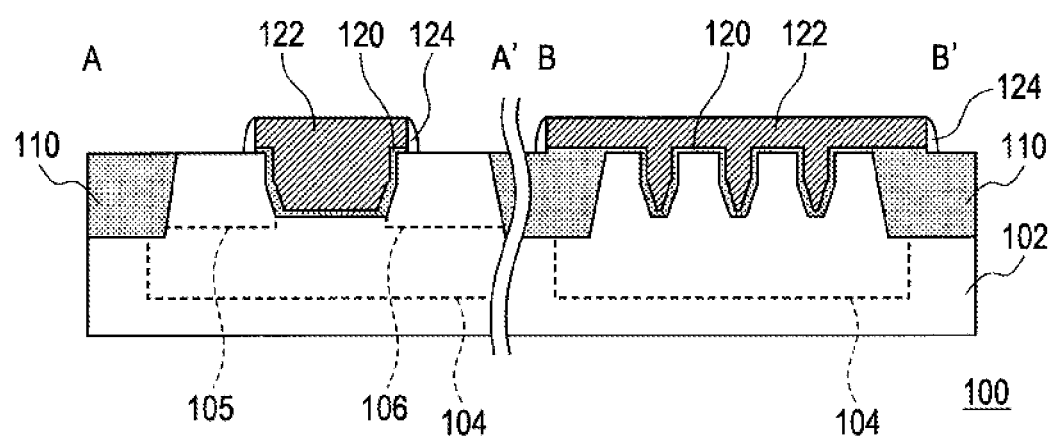
Figure 9:
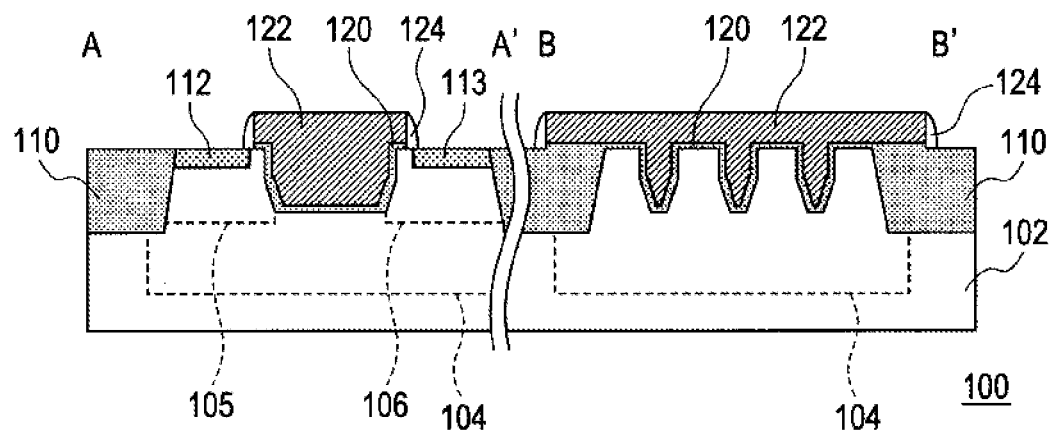
FIG. 9 is a cross sectional step view showing an example of the manufacturing procedure of the semiconductor device in the embodiment of the invention.

Then, side walls 124 are formed on the side walls of the gate electrode 122 (FIG. 8B). The side walls 124 can be formed of an insulating film such as an oxide film or a nitride film. Then, ions of n-type impurities such as phosphorus are ion implanted over the entire surface of the substrate 102 by using the gate electrode 122 and the side wall 124 as a mask to form a source region 112 and a drain region 113 (FIG. 9). The n-type impurity concentration in the source region 112 and the drain region 113 can be set, for example, to about $1 \times 10^{20}$ atoms/cm$^3$ to $1 \times 10^{22}$ atoms/cm$^3$.

Successively, a silicide layer 114 and a silicide layer 126 are formed to the surface of the substrate 102 and the surface of the gate electrode 122 respectively. Then, an interlayer insulating film 140 is formed over the entire surface of the substrate 102, contact holes are formed in the interlayer insulating film 140, and the contact holes are buried with a conductive material to form contacts 150 and contacts 154. Thus, the semiconductor device 100 of the configuration shown in FIG. 1 to FIG. 3 is obtained.

In this embodiment, an electric field exerting on the lower end of the channel in the lower portion of the trench can be moderated by making the thickness of the gate insulating film in the lower portion of the trench side wall larger than the thickness of the gate insulating film in the upper portion of the side wall, thereby capable of suppressing the parasitic transistor operation that the transistor starts operation at a threshold voltage lower than the designed voltage. As described above, undesired effect of the parasitic transistor operation can be decreased by partially decreasing the thickness of the gate insulating film.

Further, by decreasing the thickness at the bottom of the trench side walls to less than the thickness of the gate insulating film in the lower portion of the trench side walls, the following advantageous effects can be obtained.

Figure 11:
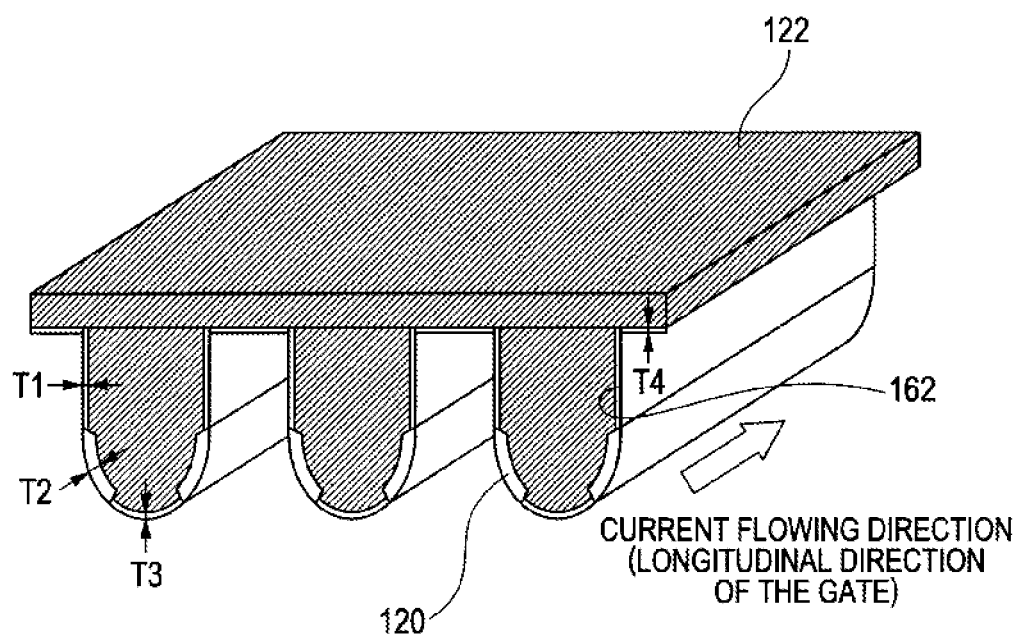
FIG. 11 is a perspective view showing a configuration of the trench portion in the embodiment of the invention.

As shown in FIG. 11 in the transistor of the semiconductor substrate 100 in this embodiment, the trench 162 extends in the longitudinal direction of the gate, which is a current flowing direction. Accordingly, by decreasing the thickness of the gate insulating film 120 at the bottom of the trench 162 to about the thickness for the upper portion of the side walls of the trench 162, the bottom portion of the trench 162 can also contribute to the transistor operation in the same manner as in the upper portion on the lateral sides of the trench 162, thereby capable of enhancing the driving performance. Further, by decreasing the thickness T4 of the gate insulating film 120 at the surface of the substrate 102, the thickness T1 of the gate insulating film 120 in the upper portion on the lateral sides of the trench 162, and the thickness T3 of the gate insulating film 120 at the bottom of the trench 162 and increasing only the thickness T2 of the gate insulating film 120 in the lower portion on the lateral sides of the trench 162 where the electric field is concentrated, the upper portion on the lateral sides and the bottom of the trench gate can be operated as a transistor having an identical threshold voltage, and operation at a low threshold voltage can be suppressed.

When the thickness of the gate insulating film 120 at the bottom of the trench 162 is also increased to about the thickness of the gate insulating film 120 in the lower portion on the lateral sides of the trench 162, the thickness of the gate insulating film 120 is increased for the entire region of the trench 162 from the lower portion of the side wall to the bottom of the trench. In such a configuration, stress is concentrated to the bottom of the trench and, correspondingly, disadvantage such as defective leak may possibly occur. Stress concentration to the bottom can be moderated by decreasing the thickness of the gate insulating film 120 at the bottom of the trench 162 to about the thickness of the gate insulating film 120 in the upper portion on the lateral sides of the trench 162.

As has been described above, when the thickness of the gate insulating film 120 at the bottom of the trench 162 is decreased to about the thickness of the gate insulating film 120 in the upper portion on the lateral sides of the trench 162, it is possible to further obtain an advantageous effect of suppressing the operation at a low threshold voltage while enhancing the driving performance and capable of moderating the stress concentration to the bottom.

Second Embodiment

In this embodiment, the shape for a trench 162 and a gate insulating film 120 and the procedure of forming them are different from those shown in the first embodiment.

In this embodiment, a planar structure of a semiconductor device 100 has the same configuration as that for the first embodiment shown in FIG. 3. FIGS. 12 to 17 are cross sectional step views showing an example of manufacturing procedures of the semiconductor device 100 in this embodiment. Also in this embodiment, drawings corresponding to a cross section along A-A' and a cross section along B-B' in FIG. 3 are shown.

Also in this embodiment, the semiconductor device 100 is formed by the same procedures as those explained for the first embodiment up to the step forming the configuration shown in FIG. 5B. Also in this embodiment, the plane direction on the surface of the substrate 102 can be formed as a (100) plane.

Figure 12A:
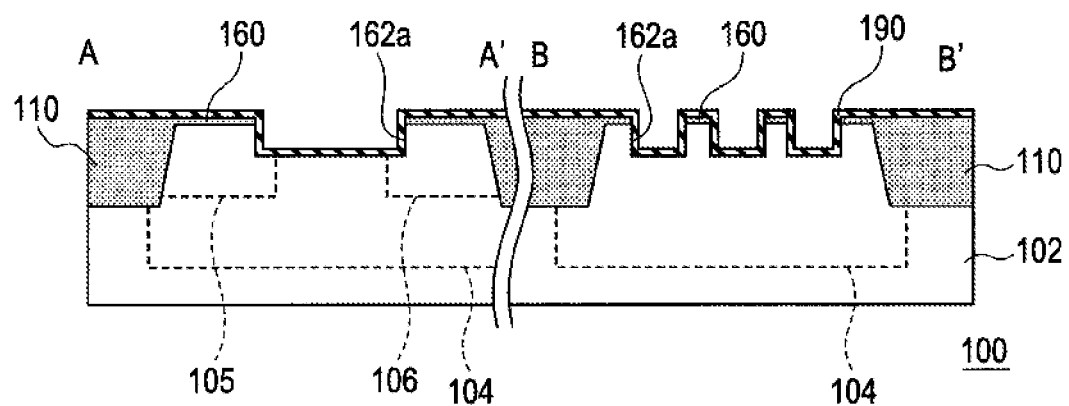

After forming the semiconductor device 100 of the configuration shown in FIG. 5B, an oxidation resistant film 190 is formed over the entire surface of a substrate 102 (FIG. 12A). The oxidation resistant film 190 can be formed, for example, of a silicon nitride film.

Figure 12B:
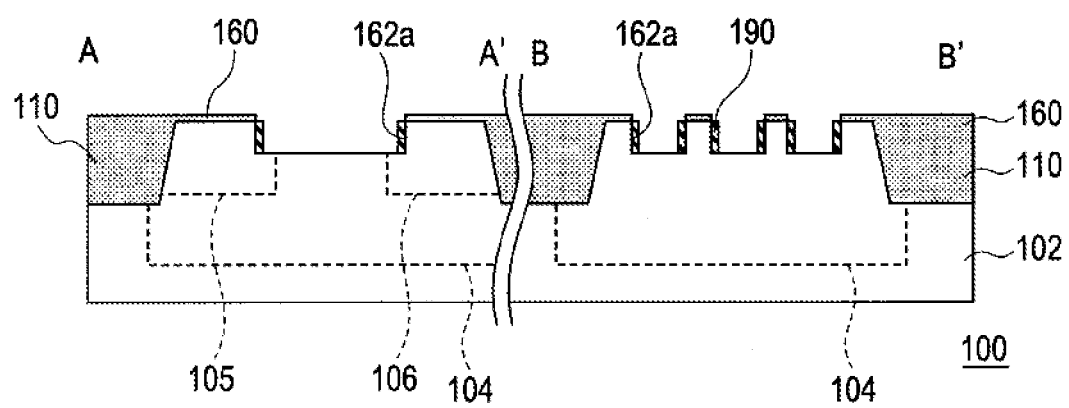

Successively, the oxidation resistant film 190 is etched back to selectively remove the oxidation resistant film 190 at the surface of the substrate 102 and at the bottom of the trench 162a. Thus, the oxidation resistance film 190 is in a state where it is formed only on the side walls of the trench 162a (FIG. 12B).

Figure 13A:
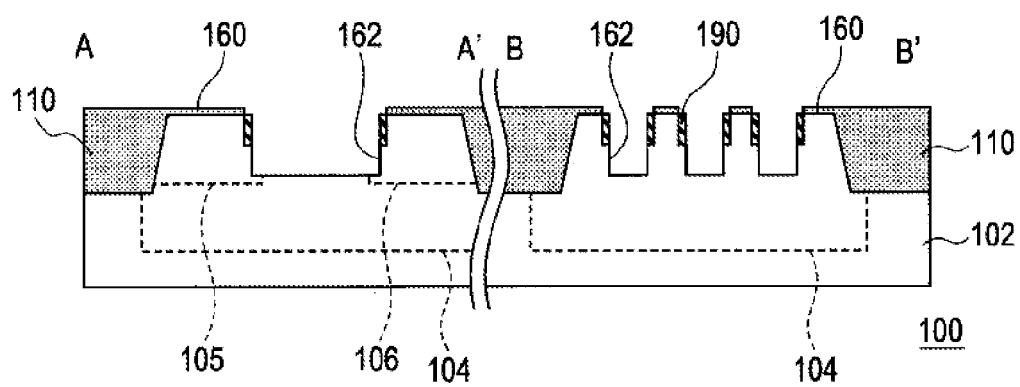
Figure 13B:
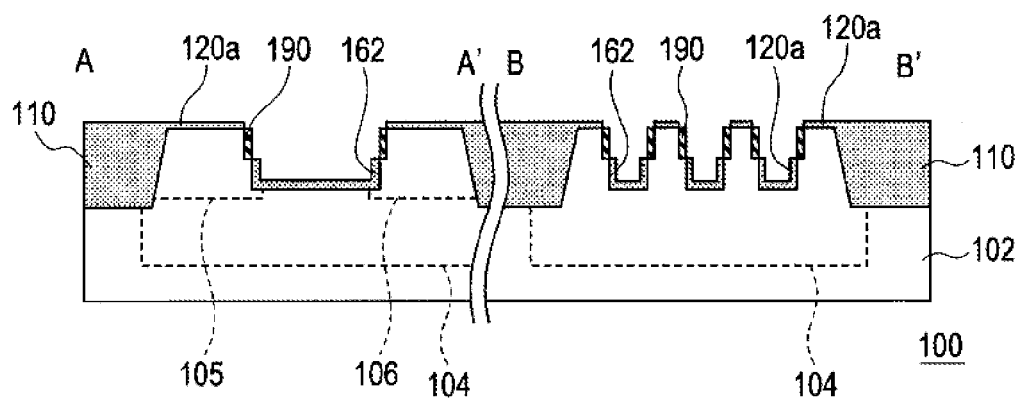

Then, in this embodiment, the substrate 102 is further etched under the same condition as that for forming the trench 162a to form a trench 162 deeper than the trench 162a (FIG. 13A). Then, after removing the thermal oxide film 160, for example, by a diluted hydrofluoric acid, the surface of the substrate 102 is thermally oxidized to form a first gate insulating film 120a in the trench 162 and at the surface of the substrate 102 (FIG. 13B). In this care, the gate insulating film 120a is not formed to a portion covered with the oxidation resistant film 190 in the trench 162.

Figure 14A:
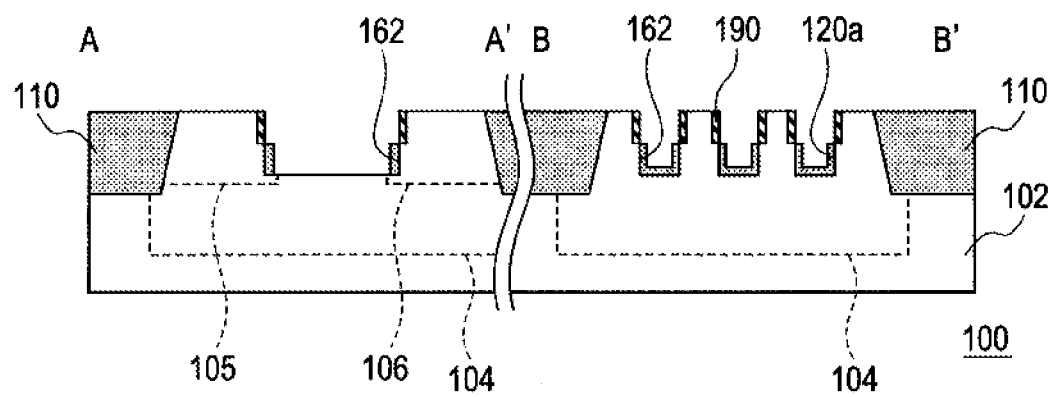
Figure 14B:
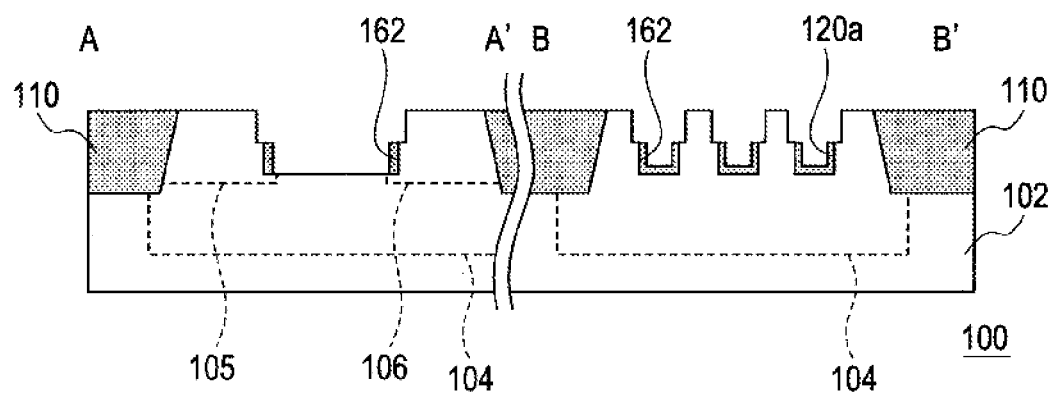

Successively, the first gate insulating film 120a is etched back to selectively remove the first gate insulating film 120a at the surface of the substrate 120 and at the bottom of the trench 162 (FIG. 14A). Then, the oxidation resistance film 190 is selectively removed (FIG. 14B).

Figure 15A:
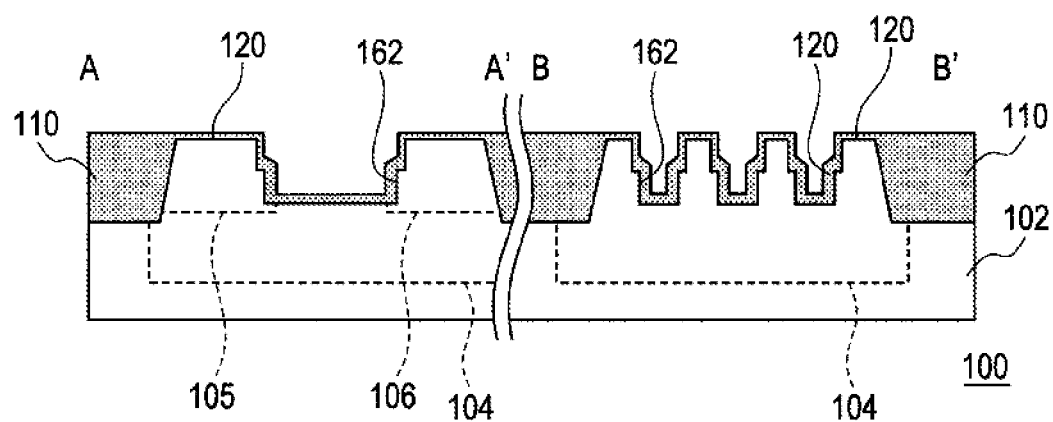

Subsequently, the surface of the substrate 102 is thermally oxidized to form a gate insulating film 120 in the trench 162 and at the surface of the substrate 102 (FIG. 15A). In this step, since the thermal oxidation film is further formed after the first gate insulating film 120a is already formed in the lower portion on the side walls of the trench 162, the thickness of the gate insulating film 120 is increased in the lower portion on the side walls of the trench 162 compared with that in the upper portion on the side wall, at the bottom of the side wall, and at the surface of the substrate 102. Further, the thickness of the gate insulating film 120 at the bottom of the trench 162 can be decreased to about the thickness of the gate insulating film 120 in the upper portion on the side wall of the trench 162 having no effect on the transistor withstanding voltage, etc. For example, the thickness of the gate insulating film 120 at the bottom of the trench 162 can be made equal with the thickness of the gate insulating film 120 in the upper portion on the side walls of the trench 162.

Figure 15B:
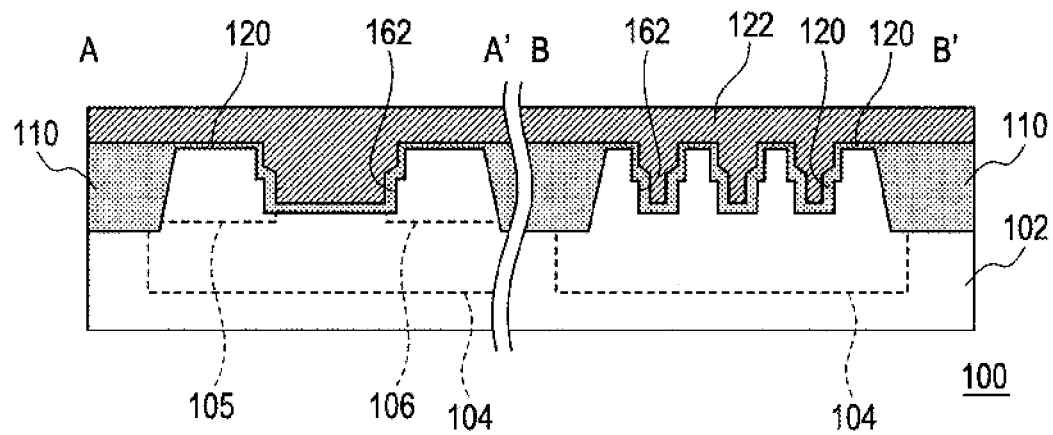
Figure 16:
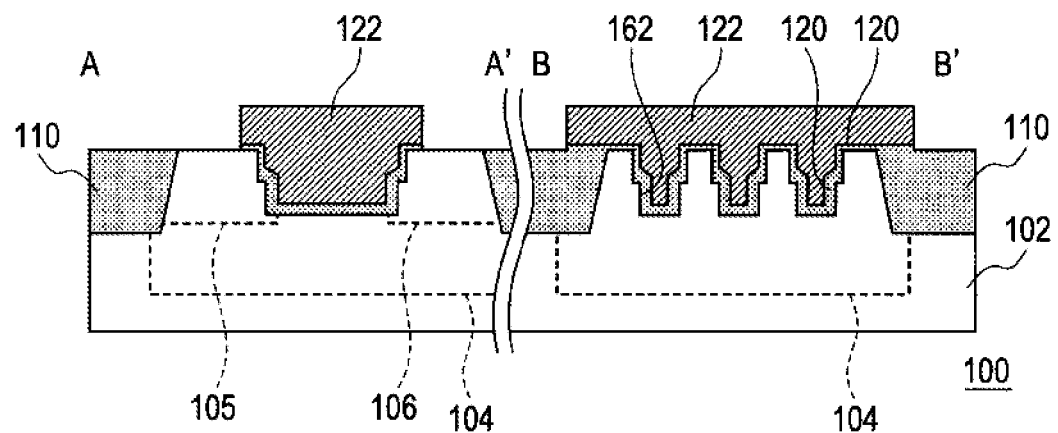
Figure 17:
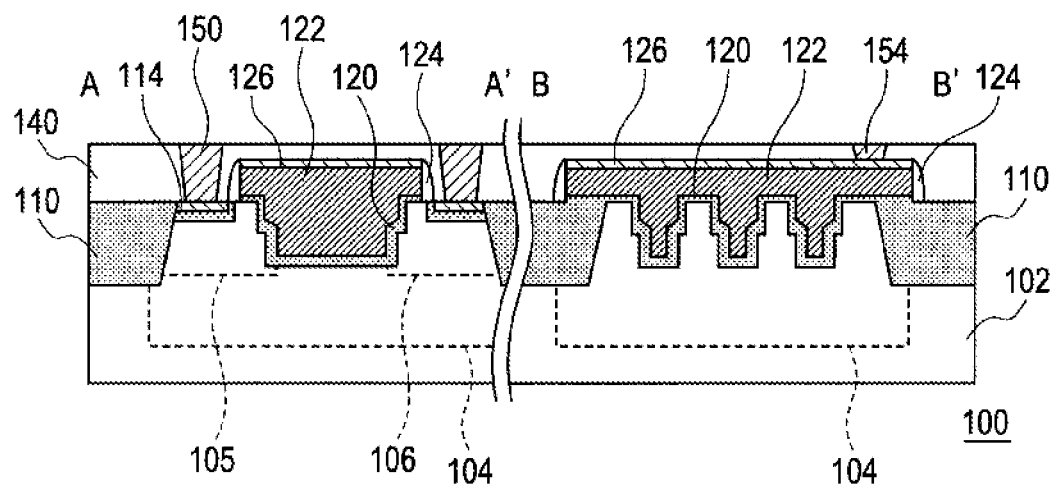

Subsequently, in the same manner as has been described for the first embodiment, a conductive film as a gate electrode 122 is formed over the entire surface of the substrate 102 (FIG. 15B). Successively, the gate electrode 122 and the gate insulating film 120 are patterned in a gate shape (FIG. 16). Then, in the same manner as described for the first embodiment, side walls 124, etc. are formed to form a transistor (FIG. 17).

Also in this embodiment, the same effect as explained for the first embodiment can be obtained. Further, an effect by decreasing the thickness at the bottom of the trench to less than the thickness of the gate insulating film in the lower portion of the side walls of the trench is further obtained.

Figure 19A:
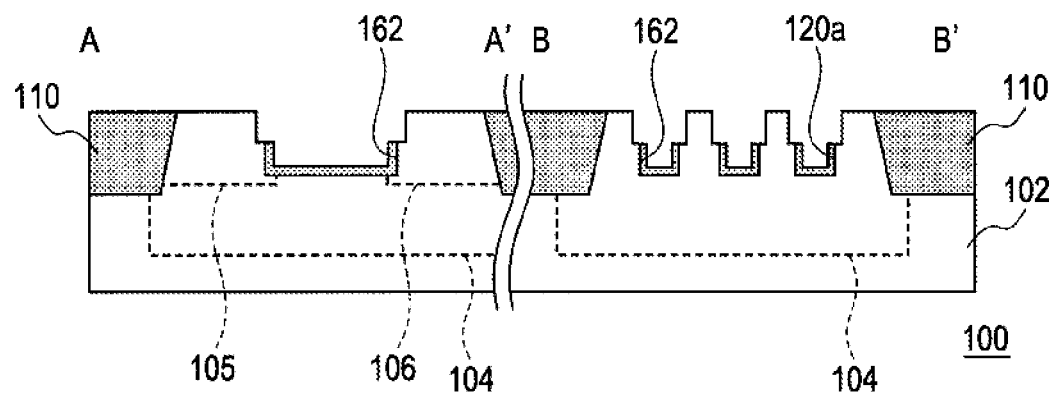
Figure 19B:
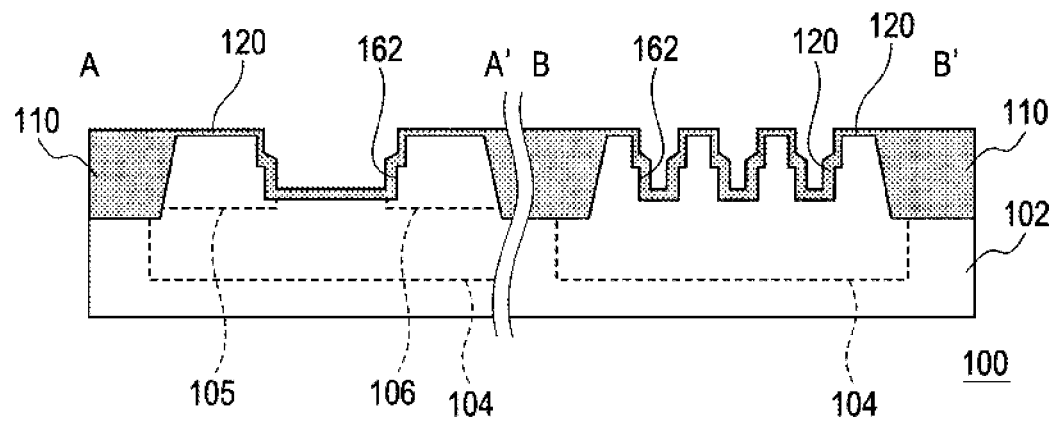
Figure 20:
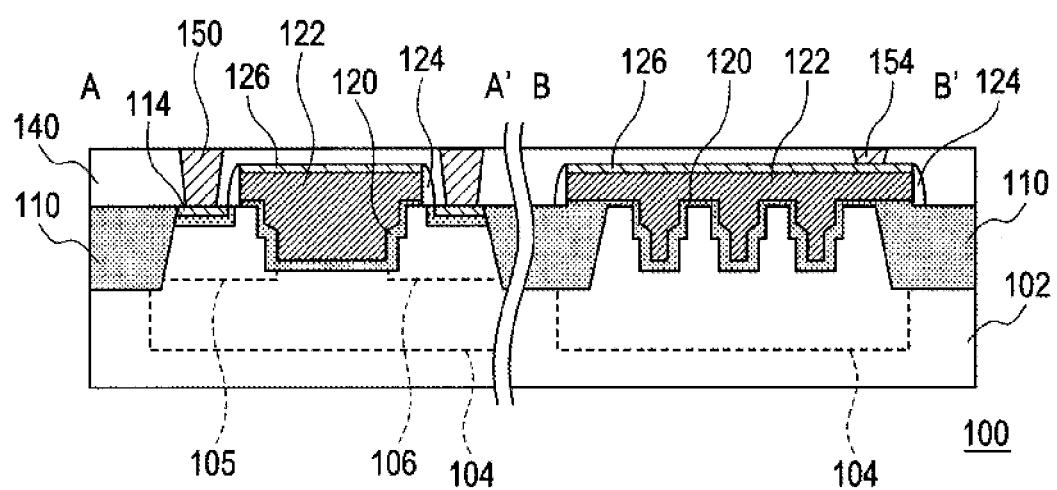

FIGS. 18 to 20 are cross sectional step views showing other example of the manufacturing procedure for the semiconductor device 100 in this embodiment. Also in this example, procedures up to the step shown in FIG. 13B may be identical with those described above.

Figure 18A:
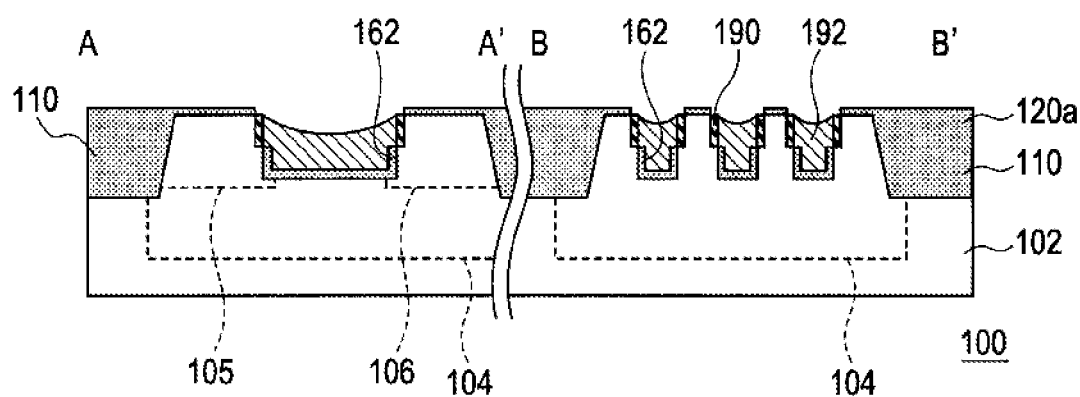
Figure 18B:
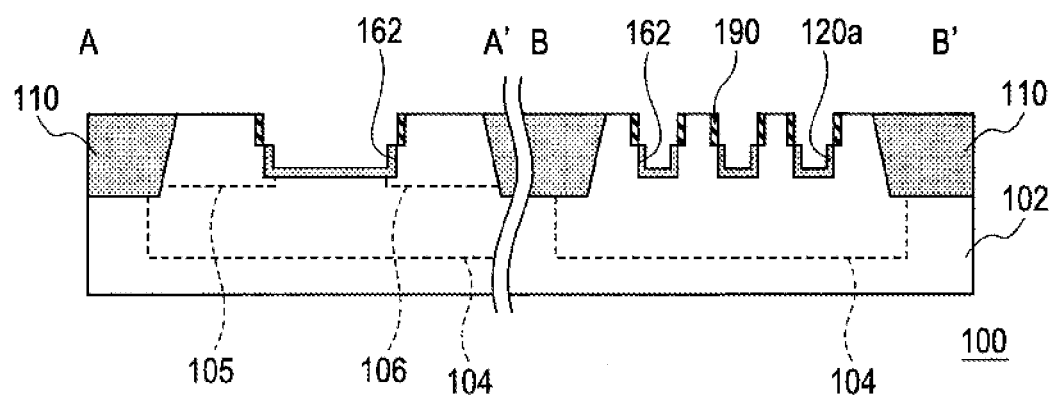

Then, inside of the trench 162 is filled with a resist film 192 (FIG. 18A). Then, a first gate insulating film 120a exposed to the outside of the trench 162 on the surface of a substrate 102 is removed. Successively, the resist film 192 is removed (FIG. 18B). Then, an oxidation resistant film 190 is selectively removed (FIG. 19A).

Then, the surface of the substrate 102 is thermally oxidized to form a gate insulating film 120 in the trench 162 and at the surface of the substrate 102 (FIG. 19B). In this step, since the thermal oxide film is formed further after already forming the first gate insulating film 120a in the lower portion of the side walls and at the bottom of the trench 162, the thickness of the gate insulating film 120 is increased compared with that in the upper portion on the side walls and at the surface of the substrate 102.

Then, a transistor is formed by the same procedures as those explained for the first embodiment (FIG. 20).

Figure 21A:
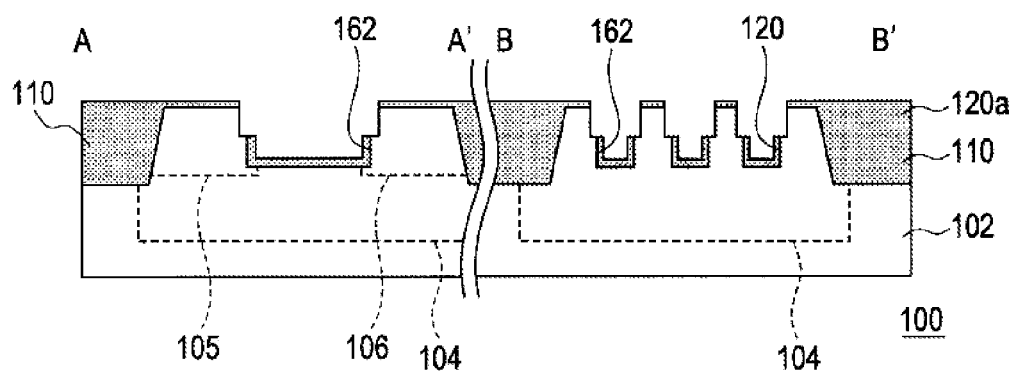
Figure 21B:
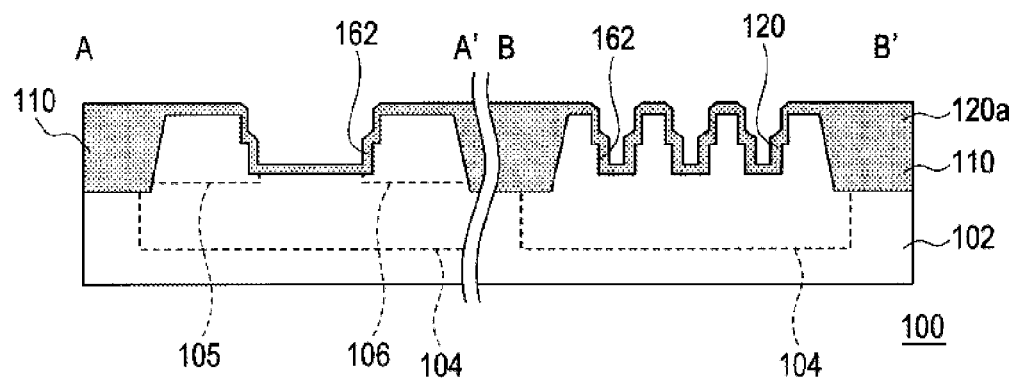
Figure 22:
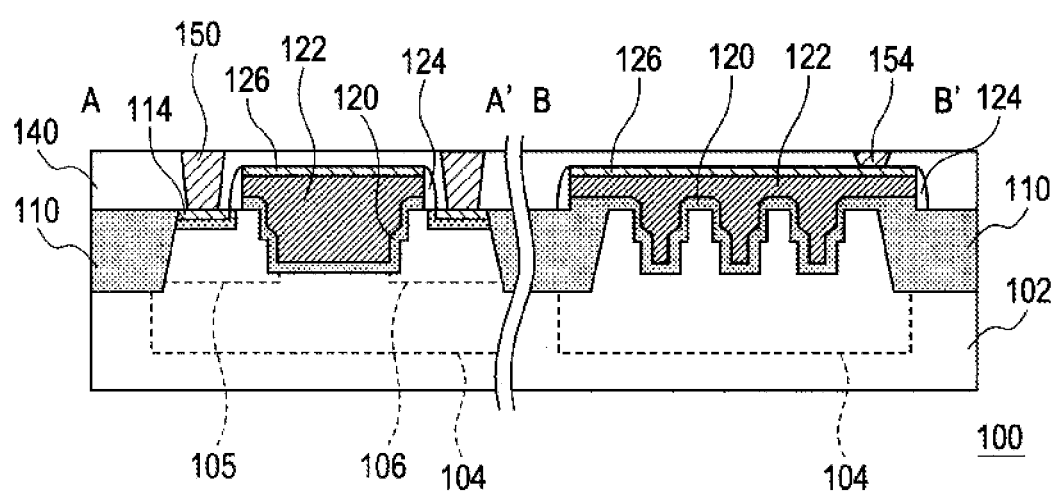
FIG. 22 is cross sectional step view showing a further example of the manufacturing procedure of the semiconductor device in the embodiment of the invention.

FIG. 21 and FIG. 22 are cross sectional step views showing a further example of the manufacturing procedure of the semiconductor device 100 in this embodiment. Also in this example, procedures up to the step shown in FIG. 13B may be identical with those described above.

After forming the semiconductor device 100 of the configuration shown in FIG. 13B, an oxidation resistant film 190 is removed selectively (FIG. 21A). Then, the surface of the substrate 102 is thermally oxidized to form a gate insulating film 120 inside of the trench 162 and at the surface substrate 102 (FIG. 21B). In this example, the thermally oxide film is further formed also on the surface of the substrate 102 where the first gate insulating film 120a has already been formed in addition to the lower portion and at the bottom of side walls of trench 162. Accordingly, the thickness of the gate insulating film 120 is increased in the lower portion of the side wall, at the bottom of the side wall of the trench 162, and at the surface of the substrate 102 compared with the upper portion of the side wall.

Then, a transistor is formed by the same procedures as those described for the first embodiment (FIG. 22).

While preferred embodiments of the present invention have been described with reference to the drawings, they are examples of the invention and various other configurations than those described above can also be adopted.

Also in the configuration of the first embodiment, the thickness of the gate insulating film 120 at the bottom of the trench 162 and at the surface of the substrate 102 can be made about identical with the thickness for the lower portion on the side walls of the trench 162, respectively.

What is claimed is:

1. A semiconductor device comprising:
   a substrate including a device forming region partitioned by a device isolation insulating film; and
   a transistor formed in the device forming region of the substrate, the transistor including:
   a gate;
   a plurality of trenches each including:
      a bottom;
      sidewalls that include a lower portion between the bottom of the trench and an intermediate portion of the side wall, and an upper portion between a surface of the substrate and the intermediate portion; and
      a depth that changes in a lateral direction of the gate;
   a gate insulating film formed on the side walls and at the bottom of each of the trenches, the gate insulating film having a first thickness at the lower portion of the trenches, a second thickness at the upper portion of the trenches, and a third thickness at the bottom of the trenches, the first thickness being greater than the second thickness and greater than or equal to the third thickness;
   a gate electrode formed over the gate insulating film so as to fill the trenches;
   a source region formed on one side of the gate electrode in a longitudinal direction of the gate at the surface of the substrate; and
   a drain region formed on the other side of the gate electrode in the longitudinal direction at the surface of the substrate.

2. The semiconductor device according to claim 1, wherein the first thickness of the gate insulating film is greater than the third thickness of the gate insulating film.

3. The semiconductor device according to claim 1, wherein the trenches are tapered at the lower portion of the side wall such that an area in a plane direction is gradually narrowed toward the bottom of the trench, and the second thickness of the gate insulating film in the tapered portion is formed larger than that of other portions of the side wall.

4. The semiconductor device according to claim 3, wherein the plane direction at the surface of the substrate and at another surface perpendicular to the surface of the substrate is a (100) plane.

* * * * *